United States Patent
Iwasaki et al.

(10) Patent No.: US 8,652,601 B2
(45) Date of Patent: Feb. 18, 2014

(54) COVER FILM

(75) Inventors: Takayuki Iwasaki, Gunma (JP); Tetsuo Fujimura, Gunma (JP); Akira Sasaki, Gunma (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 13 days.

(21) Appl. No.: 13/256,138

(22) PCT Filed: Mar. 5, 2010

(86) PCT No.: PCT/JP2010/053673
§ 371 (c)(1),
(2), (4) Date: Dec. 9, 2011

(87) PCT Pub. No.: WO2010/104010
PCT Pub. Date: Sep. 16, 2010

(65) Prior Publication Data
US 2012/0003429 A1     Jan. 5, 2012

(30) Foreign Application Priority Data

Mar. 13, 2009 (JP) .................................. 2009-060439
Jul. 1, 2009 (JP) .................................. 2009-156879

(51) Int. Cl.
*B32B 27/32* (2006.01)
*G11B 5/64* (2006.01)

(52) U.S. Cl.
USPC .......... 428/35.7; 428/212; 428/141; 428/409; 428/500; 428/521

(58) Field of Classification Search
USPC .......... 428/141, 332, 409, 34, 523, 347, 339, 428/34.1
See application file for complete search history.

(56) References Cited

U.S. PATENT DOCUMENTS

| 4,207,109 A * | 6/1980 | Campbell et al. ............. 430/536 |
| 5,126,198 A * | 6/1992 | Schinkel et al. ............. 428/349 |
| 6,902,795 B1 | 6/2005 | Ishii et al. |
| 2005/0192404 A1 | 9/2005 | Ishii et al. |
| 2006/0199005 A1 * | 9/2006 | Fuji et al. ..................... 428/347 |
| 2007/0184243 A1 * | 8/2007 | Ono et al. ..................... 428/141 |

FOREIGN PATENT DOCUMENTS

| JP | 8 324676 | 12/1996 |
| JP | 10 250020 | 9/1998 |
| JP | 2000 327024 | 11/2000 |
| JP | 3241220 | 10/2001 |
| JP | 2003 237882 | 8/2003 |
| JP | 2004 51106 | 2/2004 |
| JP | 2004 244115 | 9/2004 |
| JP | 2005 178073 | 7/2005 |
| JP | 2006 327624 | 12/2006 |
| JP | 2007 90725 | 4/2007 |

OTHER PUBLICATIONS

International Search Report issued Jun. 15, 2010 in PCT/JP10/053673 filed Mar. 5, 2010.

* cited by examiner

*Primary Examiner* — Ellen S Raudenbush
(74) *Attorney, Agent, or Firm* — Oblon, Spivak, McClelland, Maier & Neustadt, L.L.P.

(57) ABSTRACT

A cover film comprising a substrate layer, an intermediate layer comprising a resin composition containing 50% by mass or more of a metallocene linear low-density polyethylene resin having a density of 0.900 to $0.940 \times 10^3$ kg/m$^3$, and a sealant layer comprising an ethylene-type copolymerized resin containing 50 to 85% by mass of an olefin component.

18 Claims, 3 Drawing Sheets

COVER FILM

This application is a 371 of PCT/JP10/53673 filed Mar. 5, 2010. Priority to Japanese patent applications 2009-060439 filed Mar. 13, 2009 and 2009-156879 filed Jul. 1, 2009, are claimed.

TECHNICAL FIELD

The present invention relates to a cover film for carrier tape used in the packaging of electronic components.

BACKGROUND ART

The miniaturization of electronic devices has been accompanied by advances in compactness and performance of the electronic components used, and the assembly of electronic devices often involves automatically mounting the electronic components onto a printed circuit board. Generally, electronic components for surface mounting are stored and transported in the form of electronic component packages formed by encasing them in carrier tape having consecutively embossed pockets for housing the electronic components, overlaying a cover film on the tape surface of the carrier tape to form a lid material, and continuously heat sealing with a seal bar. The cover film may be of a type having a sealant layer formed of a thermoplastic resin laminated over a base material comprising a biaxially stretched polyester film.

When mounting electronic components during the production of electronic devices, the cover film is peeled from the carrier tape using an automatic peeling device, the electronic components housed in the carrier tape are extracted by a pickup device, and mounted on the surface of an electronic circuit board. For this reason, it is particularly important for the peel strength of the cover film with respect to the carrier tape to be made stable within an appropriate range. If the peel strength is too high, the cover film can tear during peeling, and if too weak, the cover film can come away from the carrier tape during storage or transport, and the electronic components contained therein may be lost. In particular, the rapid advances in mounting speed have led to very high cover film peeling rates of 0.1 seconds per tact or less, which places great stress on the cover film during peeling. As a result, there is a problem called "film breakage" in which the cover film is torn.

The peel strength required to peel the cover film from the carrier tape is defined under the JIS C0806-3 standard as 0.1 to 1.0 N for 8 mm carrier tape and 0.1 to 1.3 N for 12 mm to 56 mm carrier tape, when the peeling rate is 300 mm per minute. However, during the actual process of mounting electronic components, the peeling rate is faster than 300 mm per minute, and particularly when housing large connector components, they are often sealed with a peel strength close to the upper limit, as a result of which film breakage is liable to occur when peeling the cover film.

As a countermeasure against film breakage, a method of providing an intermediate layer excelling in impact resistance and tear propagation resistance such as polypropylene, nylon or polyurethane between a substrate of biaxially stretched polyester film or the like and a sealant layer has been proposed (see Patent Documents 1-3). On the other hand, a method of using a metallocene linear low-density polyethylene (m-LLDP) of a certain specific gravity as the intermediate layer and further giving the adhesive layer between the intermediate layer and the substrate layer a low Young's modulus to prevent the propagation of stresses to the substrate layer has also been proposed (see Patent Document 4). Additionally, a method of using a mixture of polyethylene or polypropylene with a styrene-butadiene-styrene block copolymer as the sealant resin composition for the purpose of obtaining a cover film with stable sealing properties having low sealing temperature dependence and change over time of the peel strength has been proposed (see Patent Document 5). However, even with these methods, it is difficult to avoid film breakage during high-speed peeling of 100 m per minute.

Furthermore, a cover film with improved interlayer adhesive force by coextrusion of layers formed of styrene hydrocarbon resins has been proposed (see Patent Document 6). However, even with this method, the stability of the peel strength after heat sealing is inadequate.

Additionally, during high-speed peeling, there is extensive generation of static electricity due to peeling, requiring prevention of electrostatic damage during peeling.

Techniques for reducing the generation of static electricity during peeling include a technique of kneading conductive powders such as conductive carbon particles and metal oxides or metal microparticles into the sealant layer of the cover film (see, e.g., Patent Document 1). However, since metal oxides are relatively expensive, they can easily lead to increased costs, and since it is not easy to uniformly disperse metal oxides into the sealant layer, dispersion problems can cause disparities in peel strength.

Additionally, while the dispersion of surfactants into the sealant layer (see Patent Document 7) has been proposed, when an electronic component package formed of a carrier tape heat sealed by a cover film is stored for days in a high-temperature, high-humidity environment, the surfactant can migrate to the surface of the sealant layer, reducing the peel strength and causing the cover film to peel.

Furthermore, a method of not mixing conductive microparticles and the like into the sealant layer but providing a charge transfer layer between the substrate layer and the sealant layer to prevent static electricity from accumulating on the sealant surface layer has been proposed (see Patent Document 8). Such methods of heat sealing by means of a sealant layer not containing foreign articles such as conductive microparticles are intended to stabilize the peel strength, and in that sense, they are highly effective. However, the miniaturization of electronic components has led to a demand for even higher levels of suppression of static electricity generated on the surface of the sealant layer, and the demanded performance may not be achievable.

In addition to the above properties, the cover film must have high transparency to enable the contained electronic components to be easily identified. For example, inspection of electronic components such as IC's often involves identifying defects such as deformation of IC pins by image analysis using a CCD camera positioned above the cover film, in which case a highly transparent cover film is necessary. In order to efficiently perform such identification, the cover film must have a haze value of 50% or less and a total transmission of at least 75%.

Patent Document 1: Japanese Patent No. 3241220
Patent Document 2: JP H10-250020A
Patent Document 3: JP 2000-327024A
Patent Document 4: JP 2006-327624A
Patent Document 5: JP H8-324676A
Patent Document 6: JP 2007-90725A
Patent Document 7: JP 2004-51106A
Patent Document 8: JP 2005-178073A

SUMMARY OF THE INVENTION

The present invention offers a cover film that is not susceptible to "film breakage" even during high-speed peeling, and excelling in heat sealing properties, stability of peel strength and transparency.

Furthermore, the invention offers, in addition to the above properties, a cover film that is capable of suppressing the electrostatic damage that may occur as a result of the peeling.

Additionally, the invention offers an electronic component package that is particularly suited to high-speed mounting of electronic components.

The present invention employs the below-indicated means for solving the above problems. In other words, the present invention offers the following cover film or electronic component package.

(1) A cover film to be heat sealed onto a carrier tape for housing electronic components, comprising a substrate layer; an intermediate layer formed of a resin composition comprising, by at least 50 mass %, a metallocene linear low-density polyethylene resin having a density of 0.900 to 0.940×10³ kg/m³; and a sealant layer formed of an ethylenic copolymer resin comprising, by 50 to 85 mass %, an olefin component.

(2) A cover film in accordance with (1), wherein the olefin component in the ethylenic copolymer resin constituting the sealant layer is chosen from the group consisting of ethylene propylene, butene, butadiene and isoprene.

(3) A cover film in accordance with (2), wherein the ethylenic copolymer resin constituting the sealant layer is chosen from the group consisting of ethylene-propylene random copolymer resins, ethylene-1-butene random copolymer resins, ethylene-vinyl acetate copolymer resins, ethylene-acrylic acid random copolymer resins, ethylene-acrylic acid ester random copolymer resins, ethylene-methacrylic acid random copolymer resins, ethylene-methacrylic acid ester random copolymer resins, ethylene-styrene random copolymer resins, hydrogenated styrene-butadiene block copolymer resins, hydrogenated styrene-isoprene block copolymer resins, hydrogenated styrene-butadiene-styrene block copolymer resins and hydrogenated styrene-isoprene-styrene copolymer resins.

(4) A cover film in accordance with (3), wherein the ethylenic copolymer resin constituting the sealant layer is chosen from the group consisting of ethylene-acrylic acid ester random copolymer resins, ethylene-methacrylic acid ester random copolymer resins, hydrogenated styrene-butadiene-styrene block copolymers and hydrogenated styrene-isoprene-styrene block copolymers.

(5) A cover film in accordance with any one of (1) to (4), wherein the sealant layer comprises, by 5 to 30 mass %, organic microparticles or inorganic microparticles.

(6) A cover film in accordance with any one of (1) to (5), wherein the substrate layer comprises a biaxially stretched polyethylene terephthalate or a resin composition comprising a biaxially stretched polyethylene terephthalate.

(7) A cover film in accordance with any one of (1) to (6) comprising, on the surface of the sealant layer side, an anti-static layer formed of a resin composition comprising, dispersed in an acrylic resin, a cationic macromolecular anti-static agent having a side chain with a quaternary ammonium salt represented by the following general formula:

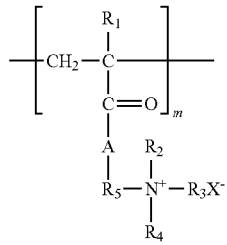

wherein A represents an oxygen atom or an imino group, $R_1$ represents a hydrogen atom or a methyl group, $R_2$, $R_3$ and $R_4$ represent alkyl groups having 1 to 18 carbon atoms which may be identical or different, $R_5$ represents an alkylene group having 1 to 4 carbon atoms, $X^-$ represents an anion and m represents an integer in the range of 1 to 5000.

(8) A cover film in accordance with (7), wherein the proportion between the cationic macromolecular ant-static agent and the acrylic resin in the resin composition constituting the anti-static layer is 20 to 60 mass % cationic macromolecular anti-static agent and 40 to 80 mass % acrylic resin.

(9) A cover film in accordance with (7) or (8), wherein the anti-static layer comprises, by 10 to 50 mass %, organic microparticles or inorganic microparticles.

(10) An electronic component package having a cover film in accordance with one of (1) to (9) heat sealed to an embossed carrier tape housing electronic components.

The cover film of the present invention is capable of adequately suppressing the occurrence of "film breakage" during high-speed peeling from a carrier tape, and excels in heat sealing properties, stability of peel strength and transparency. Furthermore, the cover film of the present invention, in addition to the above properties, also suppresses electrostatic damage during peeling. Additionally, the electronic component package of the present invention which is obtained using such a cover film is particularly suited to high-speed mounting of electronic components.

Figure 1:
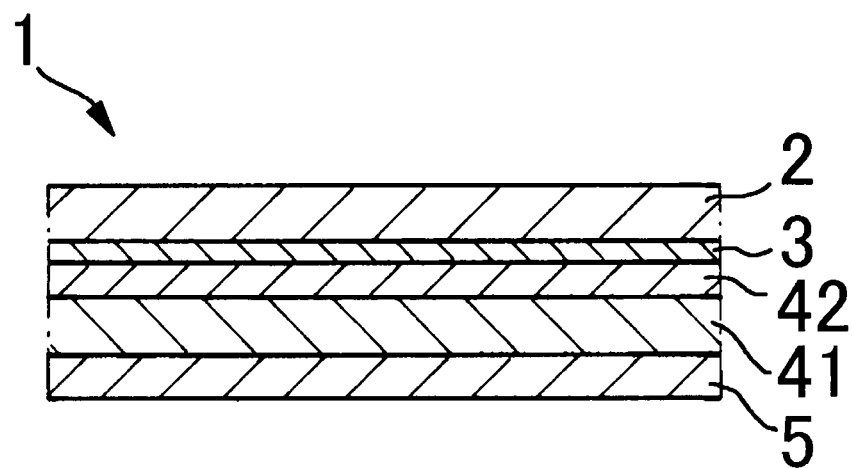
FIG. 1 A schematic section view of a cover film according to an embodiment of the present invention wherein the intermediate layer comprises two layers.

| DESCRIPTION OF REFERENCE NUMBERS | |
|---|---|
| 1 | cover film |
| 2 | substrate layer |
| 3 | anchor coating layer |
| 4 | intermediate layer |
| 41 | first intermediate layer |
| 42 | second intermediate layer |
| 5 | sealant layer |
| 6 | anti-static layer |
| 101 | wall |
| 102 | double-sided adhesive tape |
| 103 | carrier tape |
| 104 | clip |
| 105 | string |
| 106 | weight |

MODES FOR CARRYING OUT THE INVENTION

Herebelow, modes for carrying out the present invention shall be explained.

The cover film according to the present embodiment comprises at least a substrate layer, an intermediate layer and a sealant layer.

[Substrate Layer]

The substrate layer comprises a biaxially stretched polyethylene terephthalate or a resin composition having biaxially stretched polyethylene terephthalate as the main constituent. The biaxially stretched polyethylene terephthalate may be one that is commercially available, and may have an anti-static agent applied or kneaded in as an anti-static treatment, or subjected to a corona treatment or weldability treatment. If the substrate layer is too thin, "film breakage" may occur when peeling the cover film, and if too thick, heat may not be adequately transmitted to the sealant layer when heat sealing the cover film to the carrier tape, making it difficult to obtain adequate peel strength. Those with a thickness of 12 to 25 μm are preferably used.

[Intermediate Layer]

The intermediate layer is positioned between the substrate layer and the sealant layer, and may be formed of a single layer or be multi-layered with two or more layers.

The intermediate layer is formed of a resin composition having as a main constituent a linear low-density polyethylene (LLDPE) which has flexibility and high rigidity as well as a high tear strength at standard temperature. While LLDPE's include those that are polymerized with a Ziegler catalyst (Ziegler-type LLDPE's) and those polymerized with a metallocene catalyst (m-LLDPE's), the LLDPE's constituting the intermediate layer should preferably be m-LLDPE's due to the fact that the molecular weight distribution of m-LLDPE's can be narrowly controlled thereby avoiding excessive drops in the melting point and occurrence of adhesiveness due to low rates of crystallization, so that they have an especially high tear strength.

m-LLDPE's are copolymer resins having, as comonomers, ethylene and an olefin having at least 3 carbon atoms, preferably a linear α-olefin, branched α-olefin or an aromatic nucleus-substituted α-olefin having 3-18 carbon atoms. Examples of linear α-olefins include propylene, 1-butene, 1-pentene, 1-hexene, 1-octene, 1-nonene, 1-decene, 1-dodecene, 1-tetradecene, 1-hexadecene and 1-octadecene. Examples of branched α-olefins include 3-methyl-1-butene, 3-methyl-1-pentene, 4-methyl-1-pentene, 2-ethyl-1-hexene and 2,2,4-trimethyl-1-pentene. Additionally, examples of aromatic nucleus-substituted α-olefins include styrenes and the like. These comonomers may be used alone or in a combination of two or more types for copolymerization with ethylene. Additionally, they may be copolymerized with polyenes such as butadiene, isoprene, 1,4-hexadiene, dicyclopentadiene and 5-ethylidene-2-norbornene. The α-olefin content of the copolymer resin is preferably 1-20 mol % and more preferably 10-15 mol % in order to obtain effects of improving film breakage.

The m-LLDPE should preferably be at least 50 mass %, more preferably at least 70 mass % with respect to the resin composition constituting the intermediate layer. The m-LLDPE should preferably have a density in the range of 0.900 to 0.940 ($\times 10^3$ kg/m$^3$). The m-LLDPE preferably has a fluidity of 0.1 to 8.0 g/10 minutes as measured under conditions of 190° C.×5 kg load in accordance with JIS K-7112, since this enables layers to be easily formed and enables a stable peel strength to be obtained when heat sealed to carrier tape.

On the other hand, the intermediate layer contains low-density polyethylenes in the range of less than 50 mass % of the resin composition constituting the intermediate layer. The low-density polyethylene preferably has a density in the range of 0.910 to 0.929 ($\times 10^3$/kg/m$^3$). The inclusion of a low-density polyethylene improves the film forming ability.

The thickness of the intermediate layer is generally 5 to 50 μm, preferably 10 to 30 μm. If the intermediate layer is less than 5 μm thick, the adhesive strength between the substrate layer and the intermediate layer may be insufficient, and if more than 50 μm thick, the overall thickness of the cover film becomes so great that heat cannot be adequately transferred to the sealant layer when heat sealing the cover film to the carrier tape, making it difficult to obtain adequate peel strength when heat sealing the cover film to the carrier tape.

[Sealant Layer]

The sealant layer is formed of a resin composition comprising an ethylenic copolymer resin including 50 mass % to 85 mass % olefin components and 15 mass % to 50 mass % other comonomer components, more preferably 70 to 80 mass % olefin components and 20 to 30 mass % other comonomer components.

In the present invention, "olefin component" refers to monoolefin components such as ethylene, propylene and butene, and diolefin components such as butadiene and isoprene. Additionally, in the present invention, "ethylenic copolymer resin" refers to copolymer resins such that when the copolymer resin is separated into monomer units, the main constituents among the olefin units are ethylene units. For example, a hydrogenated styrene-butadiene block copolymer resin is an ethylenic copolymer resin wherein block portions to which 1,4-butadiene is polymerized constitute ethylene units due to hydrogenation. When the proportion of olefin components in the ethylenic copolymer resin is less than 50 mass %, the hot melt stretching of the ethylenic copolymer resin may be small, making molding difficult. On the other hand, if the proportion of olefin components exceeds 85 mass %, then it can be difficult to obtain adequate peel strength when heat sealing the cover film to the carrier tape.

Examples of ethylenic copolymer resins comprising monoolefin components include ethylene-propylene random copolymer resins, ethylene-1-butene random copolymer resins, ethylene-vinyl acetate copolymer resins, ethylene-acrylic acid random copolymer resins, ethylene-acrylic acid ester random copolymer resins, ethylene-methacrylic acid random copolymer resins, ethylene-methacrylic acid ester random copolymer resins and ethylene styrene random copolymer resins. Additionally, as ethylenic copolymer resins comprising diolefin components, hydrogenated block copolymer resins of aromatic vinyl compounds and covalent diene compounds may be favorably used. Examples include hydrogenated styrene-butadiene block copolymer resins, hydrogenated styrene-isoprene block copolymer resins, hydrogenated styrene-butadiene-styrene block copolymer resins and hydrogenated styrene-isoprene-styrene copolymer resins.

Of the above, ethylene-acrylic acid ester random copolymer resins, ethylene-methacrylic acid ester random copolymer resins, hydrogenated styrene-butadiene-styrene block copolymers and hydrogenated styrene-isoprene-styrene block copolymers are particularly preferred for excelling in their heat sealing properties with carrier tapes constituted from polystyrenes, polycarbonates and polyethylene terephthalates, and being less susceptible to film breakage.

Aside from the ethylenic copolymer resins described above, a resin such as polyethylene, ethylene-1-butene copolymer, polystyrene, polyacrylic acid ester or polypropylene may be added to the resin composition constituting the sealant layer in a range of less than 50 mass %.

In order to prevent blocking when winding the cover film, spherical or crushed organic particles such as acrylic particles, styrene particles and silicone particles, or inorganic particles such as talc particles, silica particles, alumina particles, mica particles, calcium carbonate and magnesium carbonate may be added to the sealant layer. In particular, acrylic particles and silica particles are favorably used because they do not reduce transparency very much when added. The most frequent diameter in a particle weight distribution curve should preferably be 1 to 20 μm, and more preferably 1 to 15 μm. If the most frequent diameter is less than 1 μm, the blocking prevention effect due to addition of particles may not be adequate. On the other hand, if it exceeds 20 μm, the blocking prevention will be good, but the cost necessary to add large quantities for blocking prevention rises, and the surface of the sealant layer on the cover film becomes visibly rough, so there is a risk of degrading the appearance of the cover film. The amount of particles added is preferably in the range of 5 to 30 mass %, more preferably 10 to 20 mass %, in the resin composition constituting the sealant layer. If the amount added is within this range, a good balance of transparency, heat sealing properties, and blocking prevention effects can be obtained.

The thickness of the sealant layer is preferably 5 to 40 μm, more preferably 7 to 20 μm. If the thickness of the sealant layer is less than 5 μm, adequate peel strength cannot be obtained when heat sealing with the carrier tape, and there is a risk of film breakage. At more than 40 μm, not only does the cost rise, but the transparency also decreases.

[Method of Producing Cover Film of Substrate Layer/Intermediate Layer/Sealant Layer Laminar Structure]

Herebelow, the method for producing a cover film formed of a substrate layer/intermediate layer/sealant layer laminar structure shall be explained with reference to FIG. 1 and FIG. 2.

There is no particular limitation on the technique for depositing the substrate layer 2, intermediate layer 4 (or 41 and 42) and sealant layer 5, and common methods may be used.

Figure 2:
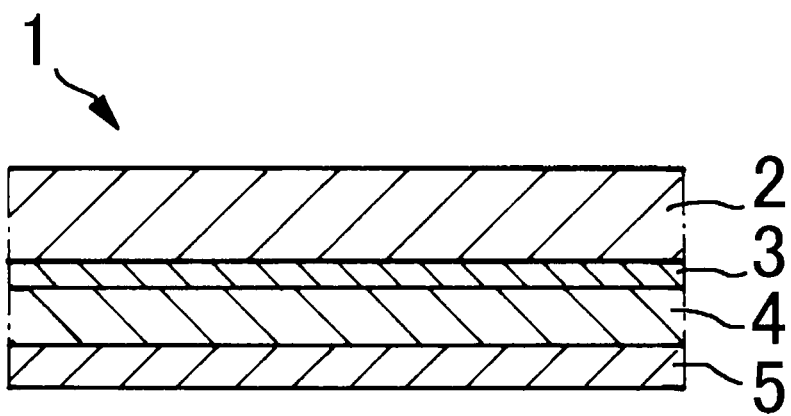
FIG. 2 A schematic section view of a cover film according to an embodiment of the present invention wherein the intermediate layer comprises one layer.

For example, in the case of the cover film 1 shown in FIG. 2, the constituents forming the sealant layer 5 are blended using a mixer such as a Henschel mixer, tumbler mixer or Mazelar, and the result is directly formed into a film using an extruder, or first knead-extruded with a uniaxial or biaxial extruder to obtain pellets, then formed into a film by further extruding the pellets with an extruder. The method of forming the film may be any method including inflation, T-die, casting or calendering, but inflation or T-die is normally used.

Next, a resin composition having as its main constituent a melted m-LLDPE to constitute the intermediate layer 4 is supplied by extrusion lamination between the film of the sealant layer 5 and a separately prepared film of the substrate layer 2, thereby producing a cover film 1 having a laminated structure of a substrate layer 2, an intermediate layer 4 and a sealant layer 5.

The die for extruding the supply of the resin composition having a melted m-LLDPE as the main constituent according to the extrusion lamination method may, for example, be a T-die. Additionally, it may have a deckle for adjusting the film width. The surface of the side of the substrate layer 2 contacting the intermediate layer 4 is preferably coated with an anchor coating agent (shown as anchor coating layer 3) such as a urethane resin as an adhesion aid. The coater for applying the anchor coating agent to the substrate layer 2 may be any type that is normally used such as a roll coater, a gravure coater, a reverse roll coater, a bar coater or a die coater.

Alternatively, the resin composition constituting the intermediate layer 4 and the resin composition constituting the sealant layer 5 may be separately melt-kneaded using a uniaxial or biaxial extruder, then integrally laminated using a feed block or multi-manifold die, then coextruded from a T-die to produce a two-layered film having the intermediate layer 4 and the sealant layer 5 laminated together, then the surface of the intermediate layer 4 side of this two-layered film may be dry laminated with a substrate layer 2 using an anchor coating agent. The device for producing the laminated film by dry lamination may be a conventional laminator.

Additionally, as with the cover film 1 shown in FIG. 1, the resin composition constituting the first intermediate layer 41 and the resin composition constituting the sealant layer 5 may be separately melt-kneaded in uniaxial or biaxial extruders, integrally laminated using a feed block or a multi-manifold die, then coextruded from a T-die to form a two-layered film formed by stacking a first intermediate layer 41 and a sealant layer 5, then a resin composition having a melted m-LLDPE as the main constituent to form a second intermediate layer 42 may be supplied by extrusion lamination between the surface on the first intermediate layer 41 side of the two-layered film and the substrate layer 2, making it possible to produce a cover film 1 having an intermediate layer formed of a plurality of layers. In this case as well, the surface on the side of the substrate layer 2 contacting the second intermediate layer 42 may be coated with an anchor coating agent (shown in the drawings as anchor coating layer 3) such as a urethane resin.

Additionally, an anti-static treatment may be performed on the substrate layer 2 as needed. The anti-static agent used on the substrate layer 2 may be a surfactant-type anti-static agent such as those of anionic type, cationic type, non-ionic type or betain type, or a macromolecular anti-static agent and conductive agent. Such anti-static agents may be applied to the substrate layer 2 by means of a roll coater using gravure rolls, lip coaters or sprays. Additionally, in order to evenly apply the anti-static agent, the film surface of the substrate layer 2 is preferably subjected to a corona discharge treatment or ozone treatment before the anti-static treatment, with a corona discharge treatment being particularly preferred.

[Anti-Static Layer]

A cover film comprising a substrate layer, an intermediate layer and a sealant layer as described above is not susceptible to "film breakage" even during high-speed peeling, and excels in heat sealing properties, stability of the peel strength and transparency, but in order to further suppress the generation of electrostatic damage due to peeling without compromising these properties, an anti-static layer is preferably formed on the surface on the sealant layer side.

The anti-static layer should preferably use a cationic macromolecular anti-static agent having a quaternary ammonium salt as a side chain, whose monomer-derived repeating units are indicated by the following general formula.

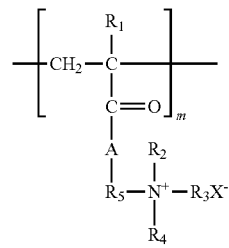

In the above Formula (1), A represents an oxygen atom or an imino group, $R_1$ represents a hydrogen atom or a methyl group, $R_2$, $R_3$ and $R_4$ represent alkyl groups having 1 to 18 carbon atoms which may be identical or different, $R_5$ represents an alkylene group having 1 to 4 carbon atoms, $X^-$ represents an anion and m represents an integer in the range of 1 to 5000.

Examples of $X^-$ include boric acid ester anions such as $[B(OCH_3)_4]^-$, $[B(OC_2H_5)_4]^-$, $[B(OC_3H_7)_4]^-$ and $[B(OC_6H_5)_4]^-$; halogen anions such as $I^-$ and $Cl^-$; $H_2PO_4^-$, $BF_4^-$, $CH_3SO_4^-$, $C_2H_5SO_4^-$, $CH_3COO^-$, $NO_3^-$, $SbF_6^-$ and $PF_6^-$, which may be respectively identical or different as structural units. Halogen anions, $CH_3SO_4^-$ and $C_2H_5SO_4^-$ particularly excel in anti-static properties and can be favorably used.

As the cationic macromolecular anti-static agent having the above-described structure, those that are publicly known may be used, and those in the form of aqueous solutions or aqueous emulsions are preferably used. These may be those that are generally available from the market, examples of specific products including Saftomer ST1000, Saftomer ST-2000 (Mitsubishi Chemical), ASA-29CP, ASA-31CP (Takamatsu Oil & Fat), Bondeip P A, Bondeip P M (Konishi) and SF anti-static coat M-2 (DIC).

The anti-static layer is constituted from an acrylic resin in which the aforementioned cationic macromolecular anti-static agent is dispersed. Its composition is preferably 20 to 60 mass % cationic macromolecular anti-static agent and 40 to 80 mass % acrylic resin, more preferably 30 to 50 mass % cationic macromolecular anti-static agent and 50 to 70 mass % acrylic resin. When the amount of cationic macromolecular anti-static agent is less than 20 mass %, it is difficult to obtain adequate anti-static properties, and when in excess of 60 mass %, it is difficult to obtain adequate peel strength when heat sealing a carrier tape with the cover film.

The acrylic resin used in the anti-static layer is a copolymer resin formed by polymerization of monomers of an aliphatic unsaturated carboxylic acid and/or an aliphatic unsaturated alkyl carboxylic acid ester, and a copolymer resin of ethylene-aliphatic unsaturated carboxylic acid and/or aliphatic unsaturated alkyl carboxylic acid ester. As examples of the aliphatic unsaturated carboxylic acid and/or aliphatic unsaturated alkyl carboxylic acid ester, one or more acrylic acid and ester derivatives of $C_1$ to $C_{12}$ alcohols and acrylic acid such as methyl acrylate, ethyl acrylate, propyl acrylate, n-butyl acrylate, hexyl acrylate and 2-ethylhexyl acrylate, as well as methacrylic acid and ester derivatives of $C_1$ to $C_{12}$ alcohols and methacrylic acid such as methyl methacrylate and ethyl methacrylate may be used. Among these, aliphatic unsaturated carboxylic acid esters are preferably used, and n-butyl methacrylate, ethyl methacrylate and methyl methacrylate are particularly preferred for excelling in water resistance. While these aliphatic unsaturated carboxylic acids and/or alkyl carboxylic acid esters may be used singly, it is also possible to use two or more types in combination.

The acrylic resin may be further blended with an additive such as a dispersion stabilizer, a lubricant or an anti-oxidant as needed. Additionally, the acrylic resin may be crosslinked by adding a crosslinking agent. Furthermore, spherical or crushed organic particles such as acrylic particles, styrene particles and silicone particles, or inorganic particles such as talc particles, silica particles, alumina particles, mica particles, calcium carbonate and magnesium carbonate may be added for the purpose of preventing blocking. In particular, silica particles and alumina particles are preferably used for causing little decrease in transparency when added. The amounts of these particles added are preferably in the range of 10 to 50 mass % in the resin composition constituting the anti-static layer, and more preferably 15 to 35 mass %. If the amount added is within this range, a good balance is achieved between the transparency, heat sealing properties and blocking prevention effects.

[Method of Producing Cover Film of Substrate Layer/Intermediate Layer/Sealant Layer/Anti-static Layer Laminar Structure]

Figure 3:
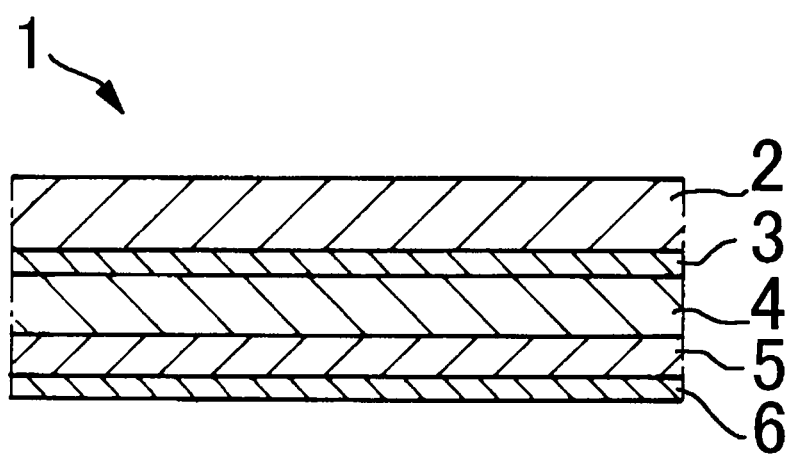
FIG. 3 A schematic section view of a cover film according to an embodiment of the present invention having an anti-static layer on the surface on the sealant layer side.

Herebelow, FIG. 3 will be used to explain the method of producing a cover film formed of a substrate layer/intermediate layer/sealant layer/anti-static layer laminar structure.

A cover film 1 with a laminar structure formed of a substrate layer 2/intermediate layer 4/sealant layer 5/anti-static layer 6 is typically produced by producing a laminated film formed of a substrate layer 2/intermediate layer 4/sealant layer 5 by the method described above, then forming an anti-static layer 6 on the surface on the sealant layer 5 side.

Regarding the formulation for forming an anti-static layer 6 on the surface on the sealant layer 5 side of the laminated film, a conventional method may be used. For example, an anti-static layer 6 may be formed by directly coating the surface on the sealant layer 5 side with an aqueous solution or aqueous emulsion containing the resin composition to form the anti-static layer 6, then drying. The coating method may be any known technique such as, for example, using a gravure coater, a reverse coater, a kiss coater, an air knife coater, a Mayer bar coater or a dip coater. In this case, the surface of the sealant layer 5 should preferably be subjected to a corona treatment or an ozone treatment before coating, and a corona treatment is particularly preferred.

The thickness of the anti-static layer 6 after drying should preferably be in the range of 0.1 to 1 µm, particularly 0.1 to 0.4 µm. If the thickness of the anti-static layer 6 is less than 0.1 µm, sufficient surface resistivity may not be able to be obtained, and if 1 µm is exceeded, then it will be a cause of increased costs, as well as making it difficult to obtain adequate peel strength when heat sealing the carrier tape with the cover film.

[Cover Film]

The resulting cover film can be used as a lid material for a carrier tape which is a container for housing electronic components.

A carrier tape is a ribbon-shaped article with a width of about 8 mm to 100 mm having dimples for housing electronic components formed at a predetermined spacing. The carrier tape is not particularly restricted, and any type that is commercially available may be used. While the material of the carrier tape is not particularly restricted, examples include paper, polystyrene, polyester, polypropylene, polycarbonate, polyacrylonitrile, polyvinyl chloride, and acrylonitrile/butadiene/styrene copolymer resins. The carrier tape may be of a type that has been made conductive by kneading carbon black or carbon nanotubes into the resin, provided with an anti-static property by kneading in an anti-static agent or conductive filler, or provided with an anti-static property by coating the surface of the carrier tape with a surfactant type anti-static agent or a coating solution having a conductive substance such as a polypyrrole, polythiophene or the like dispersed in an organic binder such as an acryl.

[Electronic Component Package]

Electronic components and the like are housed in the electronic component housing portion of the carrier tape, which is covered with the cover film as a lid member, and both edge portions are continuously heat sealed along the longitudinal direction of the cover film, thereby resulting in an electronic component package. Electronic component packages are normally wound onto a reel for storage and transport.

When mounting electronic components housed in an electronic component package onto an electronic circuit board, the carrier tape is advanced using holes provided on the longitudinal edges of the carrier tape, while quickly and intermittently peeling away the cover tape from the carrier tape, and extracting the electronic components one by one while checking for the presence, orientation and position of the electronic components using a pickup device.

Next, examples of possible embodiments of the present invention shall be explained in detail, but the present invention should not be construed as being limited by the descriptions of these examples.

EXAMPLES

Table 1, Table 2 and Table 3 show abbreviations, product names and/or properties of materials used in the intermediate layer, sealant layer and anti-static layer. In the tables shown in this specification, the abbreviations shown here will be used for the sake of brevity.

TABLE 1

Intermediate Layer

| Abbreviation | Product Name | Fluidity (*1) (g/10 min) | Density ($10^3$ kg/m$^3$) |
|---|---|---|---|
| m-LLDPE1 | Evolue SP3010 (Prime Polymer) | 0.8 | 0.926 |
| m-LLDPE2 | Evolue SP4030 (Prime Polymer) | 3.8 | 0.938 |
| m-LLDPE3 | Harmolex NF464N (Japan Polyethylene) | 2.0 | 0.918 |
| m-LLDPE4 | Umerit 0520F (Ube Maruzen Polyethylene) | 2.0 | 0.904 |
| m-LLDPE5 | Harmolex NH745N (Japan Polyethylene) | 8.0 | 0.913 |
| m-LLDPE6 | Umerit 021GT (Japan Polyethylene) | 6.0 | 0.919 |
| m-LLDPE7 | Excelene FX CX1001 (Japan Polyethylene) | 1.0 | 0.898 |
| Ziegler LLDPE | Ultzex 4020L (Prime Polymer) | 2.3 | 0.937 |
| HIPS | Toyostyrol HI E640N (Toyo Styrene) | — | — |
| LDPE1 | Ube Polyethylene R-500 (Ube Maruzen Polyethylene) | 0.5 | 0.922 | m-LLDPE: metallocene linear low-density polyethylene
HIPS: high-impact polystyrene
LDPE: low-density polyethylene
Note
(*1) according to JIS K-7112, measured at 190° C. × 5 kg.

TABLE 2

Sealant Layer

| Abbreviation | Product Name | Olefin Content (mass %) |
|---|---|---|
| SEBS1 | Tuftec H1041 (Asahi Kasei Chemicals) | 70 |
| SEBS2 | Tuftec H1051 (Asahi Kasei Chemicals) | 58 |
| SEBS3 | Tuftec H1062 (Asahi Kasei Chemicals) | 82 |
| SEBS4 | Tuftec H1043 (Asahi Kasei Chemicals) | 33 |
| SEBS5 | Tuftec H1221 (Asahi Kasei Chemicals) | 88 |
| SEPS1 | Septon 2007 (Kuraray) | 70 |
| SEPS2 | Septon 2063 (Kuraray) | 87 |
| SEPS3 | Septon 2104 (Kuraray) | 35 |
| EMA1 | Elvaloy 1820AC (Mitsui-DuPont Polychemicals) | 80 |
| EMA2 | Elvaloy 1609AC (Mitsui-DuPont Polychemicals) | 90 |
| EMMA1 | Acryft WH206 (Sumitomo Chemical) | 80 |
| EMMA2 | Acryft WD201 (Sumitomo Chemical) | 90 |
| SBS1 | Denka Clearen (Denki Kagaku Kogyo) | 16 |

TABLE 3

Anti-static Layer

| Abbreviation | Product Name |
|---|---|
| Cationic Polymer Anti-static Agent 1 | ASA-29CP (Takamatsu Oil & Fat) |
| Cationic Polymer Anti-static Agent 2 | SF Anti-static Coating M-2 (DIC) |
| Cationic Polymer Anti-static Agent 3 | Bondeip PM (Konishi) |
| Cationic Surfactant | Elegan (NOF) |
| Acrylic Resin Emulsion 1 | Methyl acrylate/methyl methacrylate copolymer resin emulsion "Vinyblan" (Nissin Chemical) |
| Acrylic Resin Emulsion 2 | Methyl acrylate/methyl methacrylate/n-butyl acrylate/n-butyl methacrylate/cyclohexyl methacrylate copolymer resin emulsion "NK Polymer" (Shin-Nakamura Chemical) |
| Acrylic Resin Emulsion 3 | Ethylene-methyl methacrylate copolymer resin emulsion "DIC Seal W707S" (DIC) |
| Anti-blocking Agent 2 | Aqueous colloidal silica dispersion "Snowtex" (Nissan Chemical Industries) |
| Anti-blocking Agent 3 | Aqueous colloidal alumina dispersion "Alumina Sol" (Nissan Chemical Industries) |
| EVA Emulsion | Ethylene-vinyl acetate copolymer resin emulsion "DIC Seal W701" (DIC) |
| Polyester Resin Emulsion | Pesresin A-160P (Takamatsu Oil & Fat) |

[Cover Film with Substrate Layer/Intermediate Layer/Sealant Layer Structure]

Example 1

100 parts by mass of Tuftec H1041 (Asahi Kasei Chemicals), a hydrogenated styrene-butadiene-styrene triblock copolymer and 25 parts by mass of an anti-blocking master batch "PEX ABT-16" (Tokyo Printing Ink) comprising 50 mass % low-density polyethylene, 45 mass % silica and 5 mass % talc (hereinafter referred to as "Anti-blocking Agent 1") were pre-blended in a tumbler, then kneaded at 200° C. using a uniaxial extruder of diameter 40 mm to obtain a resin composition for the sealant layer at a line speed of 20 m per minute.

This resin composition for the sealant layer and a m-LLDPE "Evolue SP3010" (Prime Polymer) for a first intermediate layer were separately extruded from a uniaxial extruder, then extrusion laminated using a multi-manifold T-die, to form a two-layered film wherein the thicknesses of the sealant layer and the first intermediate layer were respectively 10 μm and 20 μm.

On the other hand, a two-solution curable polyurethane anchor coating agent was applied to a biaxially stretched polyethylene terephthalate film (thickness 16 μm) constituting a substrate layer using a roll coater, and melted m-LLDPE "Harmolex NH745" (Japan Polyethylene) constituting a second intermediate layer was extruded to a thickness of 10 μm between the above coating surface and the first intermediate layer-side surface of the two-layered film described above, to obtain a laminated film by means of extrusion lamination.

After subjecting the sealant layer-side surface and substrate layer-side surface of the laminated film to a corona treatment, a cationic anti-static agent "SAT-6C" (Nihon Junyaku) was coated onto both surfaces of the laminated film using a gravure coater, resulting in a cover film having a substrate layer/second intermediate layer/first intermediate layer/sealant layer structure.

Examples 2-11 and Comparative Examples 1-7

Cover films were produced using the same method as Example 1, aside from the fact that the resin compositions and thicknesses shown in the following Table 4 and Table 7 were used.

Example 12

A two-layered film formed of an intermediate layer (first intermediate layer)/sealant layer was prepared in the same manner as Example 1 aside from the thickness of the first intermediate layer being 30 μm.

On the other hand, a two-solution curable polyurethane anchor coating agent was applied to a biaxially stretched polyethylene terephthalate film (thickness 16 μm) constituting a substrate layer using a roll coater, and this coated surface was laminated with the intermediate layer-side surface of the above-described two-layer film by means of dry lamination to obtain a laminated film. After subjecting the sealant layer-side surface and substrate layer-side surface of the laminated film to a corona treatment, a cationic anti-static agent "SAT-6C" (Nihon Junyaku) was coated onto both surfaces of the laminated film using a gravure coater, resulting in a cover film having a substrate layer/intermediate layer/sealant layer structure.

Examples 13-18 and Comparative Examples 8-11

Cover films were prepared in the same manner as Example 12 except that the resins or resin compositions shown in the following Table 5 and Table 8 were used as the raw materials of the intermediate layer or the sealant layer.

Example 19

A urethane anchor coating agent was coated to a dry thickness of about 1 μm onto the surface of a biaxially stretched polyethylene terephthalate film (thickness 25 μm) constituting the substrate layer, then m-LLDPE "Harmolex NH745N" (Japan Polyethylene) constituting the intermediate layer was extrusion coated to a thickness of 15 μm using a T-die, resulting in a two-layer film having a substrate layer/intermediate layer structure. Furthermore, as a resin constituting a sealant layer, a resin composition comprising 100 parts by mass of "Tuftec H1041" (Asahi Kasei Chemicals), a hydrogenated styrene-butadiene-styrene triblock copolymer, and 25 parts by mass of an anti-blocking master batch "PEX ABT-16" (Tokyo Printing Ink), was laminated to a thickness of 20 μm by extrusion coating onto the intermediate layer-side of this two-layer film to form a laminated film. After subjecting the sealant layer-side surface and substrate layer-side surface of the laminated film to a corona treatment, a cationic anti-static agent "SAT-6C" (Nihon Junyaku) was coated onto both surfaces of the laminated film using a gravure coater, resulting in a cover film having a substrate layer/intermediate layer/sealant layer structure.

Examples 20-23 and Comparative Examples 12-16

Cover films were produced using the same method as Example 19, except that the resin composition and thickness were as described in Table 6 and Table 9 below.

(Evaluation Method)

The cover films prepared in the above Examples 1-23 and Comparative Examples 1-16 were evaluated as below. The results are shown in Table 4 to Table 9.

(1) Film Formation

The thicknesses of the prepared cover films were measured at 11 points in the width direction (40 mm intervals)×3 points in the flow direction (1 m intervals) for a total of 33 points, to study the variation in thickness in a single cover film. Those with a variation in thickness of ±20% or less were rated "good" (B), while those exceeding ±20% were rated "poor" (C).

(2) Haze

The haze values were measured using an integrating sphere measuring device in accordance with measuring method A of JIS K 7105: 1998. Those for which the film formation was so poor that a film was not obtained are indicated "unrated" (na).

(3) Heat Seal

A taping device "ST-60" (Systemation) was used to heat seal the 5.5 mm wide cover films at sealing iron temperatures of 140° C. to 190° C. in 10° C. intervals to an 8 mm wide polystyrene carrier tape (Denki Kagaku Kogyo) under conditions of sealing head width 0.5 mm×2, sealing head length 32 mm, heat sealing pressure 3.5 MPa, delivery length 16 mm and heat sealing time 0.2 seconds×2 (double seal). After letting stand for 24 hours in an atmosphere of relative humidity 50% and temperature 23° C., the cover film was peeled at a speed of 300 mm per minute and a peeling angle of 180° in the same atmosphere of relative humidity 50% and temperature 23° C. Those with an average peel strength in the range of 0.3 to 0.9 N when heat sealed at sealing iron temperatures of 140° C. and 190° C. were rated "excellent" (A), those with an average peel strength in the range of 0.3 to 0.9 N when heat sealed at a sealing iron temperature of either 140° C. or 190° C. were rated "good" (B), and those with an average peel strength outside this range were rated "poor" (C). Additionally, those for which the film formation was so poor that a film was not obtained are indicated "unrated" (na).

(4) Difference Between Maximum Value and Minimum Value of Peel Strength

A taping device "ST-60" (Systemation) was used to heat seal the 5.5 mm thick cover films at sealing iron temperatures of 160° C. to 190° C. in 10° C. intervals to an 8 mm wide polystyrene carrier tape (Denki Kagaku Kogyo) under conditions of sealing head width 0.5 mm×2, sealing head length 32 mm, heat sealing pressure 3.5 MPa, delivery length 16 mm and heat sealing time 0.2 seconds×2 (double seal). The temperature of the heat sealing iron was adjusted so that, after letting stand for 24 hours in an atmosphere of relative humidity 50% and temperature 23° C., the average peel strength was 0.4 N when the cover film was peeled at a speed of 300 mm per minute and a peeling angle of 180° in the same atmosphere of relative humidity 50% and temperature 23° C. Those wherein the difference between the maximum value and minimum value of the peel strength when peeling 100 mm of carrier tape was less than 0.2 N were rated "excellent" (A), those in which it was at least 0.2 N and less than 0.3 N were rated "good" (B), and those in which it was 0.3 N or more were rated "poor" (C). Additionally, those for which the film formation was so poor that a film was not obtained are indicated "unrated" (na).

(5) Blocking

After heat sealing so that the average peel strength is 0.4 N under the same conditions as in paragraph (4) above, the sealed carrier tapes were wound onto a paper tube of diameter 95 mm so as to have the cover films on the outside, and let stand for 24 hours at 40° C. At this time, the windings were observed by eye for the presence of adhesion between the carrier tape and the cover film at areas other than the heat sealed portions, those in which adhesion was not observed were rated "good" (B), and those in which adhesion was observed were rated "poor" (C). Additionally, those for which the film formation was so poor that a film was not obtained are indicated "unrated" (na).

(6) Surface Resistivity

A resistivity meter "Hiresta Up MCP-HT40" (Mitsubishi Chemical) was used to measure the surface resistivity of the sealant surface of the cover film at an atmospheric temperature of 23° C., atmospheric humidity 50% (relative humidity) and applied voltage of 500 V using a method in accordance with JIS K6911. Additionally, those for which the film formation was so poor that a film was not obtained are indicated "unrated" (na).

(7) Film Breakage

Figure 4:
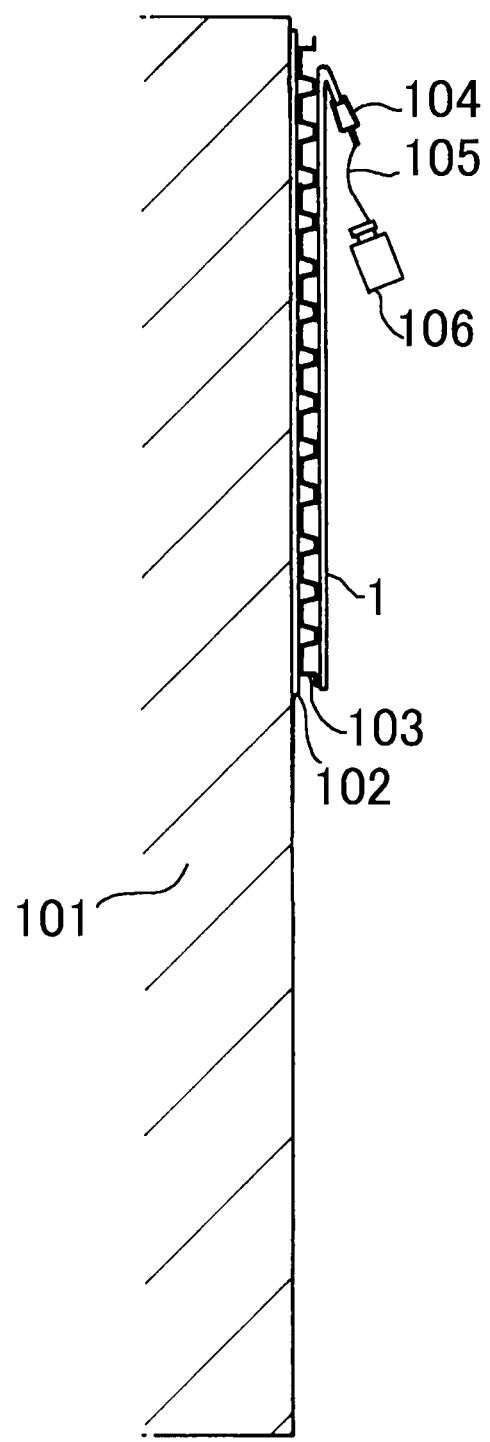
FIG. 4 A schematic view showing a method of testing the susceptibility of a cover film to film breakage.

The film breakage susceptibility was evaluated by the method shown in FIG. 4.

First, a taping device "ST-60" (Systemation) was used to seal a cover film 1 of width 21.5 mm to a 24 mm wide electronic component carrier tape 103 comprising polystyrene under conditions of sealing head width 0.5 mm×2, sealing head length 32 mm, heat sealing pressure 3.5 MPa, delivery length 16 mm and heat sealing time 0.5 seconds×2 (double seal), and the sealing head temperature was adjusted to obtain average peel strengths of 1.5 N and 2.0 N.

Next, the carrier tape 103 having the cover film 1 sealed thereto was cut to a length of 550 mm as shown in FIG. 4, and adhered with the bottom portions of the pockets of the carrier tape 103 contacting a vertical wall 101 bearing double-sided adhesive tape 102. 50 mm of the cover film 1 were peeled from the top portion of the adhered carrier tape 103, the tip of the peeled cover film 1 was sandwiched by a clip 104, and a weight 106 of mass 1000 g was attached to the clip 104 via a string 105. When the weight 106 was allowed to naturally drop, those in which the cover film 1 did not break even with an average peel strength of 2.0 N were rated "excellent" (A), those in which the cover film 1 did not break at an average peel strength of 1.5 N were rated "good" (B), and those in which the cover film broke at an average peel strength of 1.5 N were rated "poor" (C). Additionally, those for which the film formation was so poor that a film was not obtained are indicated "unrated" (na).

TABLE 4

| | | Type of Resin | Density $10^3$ kg/m³ | Olefin Content % | Ex 1 | Ex 2 | Ex 3 | Ex 4 | Ex 5 | Ex 6 |
|---|---|---|---|---|---|---|---|---|---|---|
| Intermediate | 2nd | m-LLDPE 5 | 0.913 | — | 100 | 100 | 100 | 100 | 100 | 100 |
| Layer | 1st | m-LLDPE 1 | 0.926 | — | 100 | | | | 100 | 100 |
| | | m-LLDPE 2 | 0.938 | — | | 100 | | | | |
| | | m-LLDPE 3 | 0.918 | — | | | 100 | | | |
| | | m-LLDPE 4 | 0.904 | — | | | | 100 | | |
| Sealant Layer | | SEBS 1 | — | 70 | 100 | 100 | 100 | 100 | | |
| Resin Composition | | SEBS 2 | — | 58 | | | | | 100 | |
| | | SEBS 3 | — | 82 | | | | | | 100 |
| | | SEPS 1 | — | 70 | | | | | | |
| | | Anti-blocking agent 1 | — | — | 25 | 25 | 25 | 25 | 25 | 25 |
| Evaluated | | Substrate thickness, μm | | | 16 | 16 | 16 | 16 | 16 | 16 |
| Physical | | Intermediate layer 1 thickness, μm | | | 10 | 10 | 10 | 10 | 10 | 10 |
| Properties | | Intermediate layer 2 thickness, μm | | | 20 | 20 | 20 | 20 | 25 | 20 |
| etc. | | Sealant thickness, μm | | | 10 | 10 | 10 | 10 | 5 | 10 |
| | | Cover film thickness, μm | | | 56 | 56 | 56 | 56 | 56 | 56 |
| | | Microparticle content of sealant layer, parts by mass | | | 11.1 | 11.1 | 11.1 | 11.1 | 11.1 | 11.1 |
| | | Anti-static layer coating thickness, mg/m² | | | 7 | 7 | 7 | 7 | 7 | 7 |
| | | (1) Film formation | | | B | B | B | B | B | B |
| | | (2) Haze value, % | | | 19 | 19 | 20 | 20 | 19 | 22 |
| | | (3) Heat seal | | | A | A | A | A | B | B |
| | | (4) Max/min difference of peel strength | | | A | A | A | A | B | A |
| | | (5) Blocking | | | B | B | B | B | B | B |
| | | (6) Surface resistivity, Ω/□ | | | $7.5 \times 10^9$ | $5.4 \times 10^9$ | $9.1 \times 10^9$ | $5.3 \times 10^9$ | $6.2 \times 10^9$ | $8.3 \times 10^9$ |
| | | (7) Film breakage | | | A | A | A | A | A | A |

| | | Type of Resin | Density $10^3$ kg/m³ | Olefin Content % | Ex 7 | Ex 8 | Ex 9 | Ex 10 | Ex 11 |
|---|---|---|---|---|---|---|---|---|---|
| Intermediate | 2nd | m-LLDPE 5 | 0.913 | — | 100 | 100 | 100 | 100 | 100 |
| Layer | 1st | m-LLDPE 1 | 0.926 | — | 100 | 100 | 100 | 100 | 100 |
| | | m-LLDPE 2 | 0.938 | — | | | | | |
| | | m-LLDPE 3 | 0.918 | — | | | | | |
| | | m-LLDPE 4 | 0.904 | — | | | | | |
| Sealant Layer | | SEBS 1 | — | 70 | | 100 | 100 | 100 | 100 |
| Resin Composition | | SEBS 2 | — | 58 | | | | | |
| | | SEBS 3 | — | 82 | | | | | |
| | | SEPS 1 | — | 70 | 100 | | | | |
| | | Anti-blocking agent 1 | — | — | 25 | 10 | 145 | 25 | 25 |
| Evaluated | | Substrate thickness, μm | | | 16 | 16 | 16 | 16 | 16 |
| Physical | | Intermediate layer 1 thickness, μm | | | 10 | 10 | 10 | 10 | 10 |
| Properties | | Intermediate layer 2 thickness, μm | | | 20 | 20 | 20 | 20 | 20 |
| etc. | | Sealant thickness, μm | | | 10 | 10 | 10 | 4 | 43 |
| | | Cover film thickness, μm | | | 56 | 56 | 56 | 50 | 89 |
| | | Microparticle content of sealant layer, parts by mass | | | 11.1 | 4.8 | 42.0 | 11.1 | 11.1 |
| | | Anti-static layer coating thickness, mg/m² | | | 7 | 7 | 7 | 7 | 7 |
| | | (1) Film formation | | | B | B | B | B | B |
| | | (2) Haze value, % | | | 20 | 15 | 49 | 25 | 45 |
| | | (3) Heat seal | | | A | B | B | B | B |
| | | (4) Max/min difference of peel strength | | | A | B | B | B | B |
| | | (5) Blocking | | | B | C | B | B | B |
| | | (6) Surface resistivity, Ω/□ | | | $7.3 \times 10^9$ | $4.0 \times 10^9$ | $8.9 \times 10^9$ | $4.0 \times 10^9$ | $8.9 \times 10^9$ |
| | | (7) Film breakage | | | B | A | A | B | A |

TABLE 5

| | Type of Resin | Density $10^3$ kg/m³ | Olefin Content % | Ex 12 | Ex 13 | Ex 14 | Ex 15 | Ex 16 | Ex 17 | Ex 18 |
|---|---|---|---|---|---|---|---|---|---|---|
| Intermediate Layer | m-LLDPE 1 | 0.926 | — | 100 | | | | 100 | 100 | 100 |
| | m-LLDPE 2 | 0.938 | — | | 100 | | | | | |
| | m-LLDPE 3 | 0.918 | — | | | 100 | | | | |
| | m-LLDPE 4 | 0.904 | — | | | | 100 | | | |
| Sealant Layer Resin Composition | SEBS 1 | — | 70 | 100 | 100 | 100 | 100 | | | |
| | SEBS 2 | — | 58 | | | | | 100 | | |
| | SEBS 3 | — | 82 | | | | | | 100 | |
| | SEPS 1 | — | 70 | | | | | | | 100 |
| | Anti-blocking agent 1 | — | — | 25 | 25 | 25 | 25 | 25 | 25 | 25 |
| Evaluated Physical Properties etc. | Substrate thickness, μm | | | 16 | 16 | 16 | 16 | 16 | 16 | 38 |
| | Intermediate layer thickness, μm | | | 30 | 30 | 30 | 30 | 35 | 30 | 20 |
| | Sealant thickness, μm | | | 10 | 10 | 10 | 10 | 5 | 10 | 10 |
| | Cover film thickness, μm | | | 56 | 56 | 56 | 56 | 56 | 56 | 68 |
| | Microparticle content of sealant layer, parts by mass | | | 11.1 | 11.1 | 11.1 | 11.1 | 11.1 | 11.1 | 11.1 |
| | Anti-static layer coating thickness, mg/m² | | | 7 | 7 | 7 | 7 | 7 | 7 | 7 |
| | (1) Film formation | | | B | B | B | B | B | B | B |
| | (2) Haze value, % | | | 25 | 24 | 24 | 24 | 24 | 23 | 24 |
| | (3) Heat seal | | | A | A | A | A | B | B | B |
| | (4) Max/min difference of peel strength | | | A | A | A | A | B | A | A |
| | (5) Blocking | | | B | B | B | B | B | B | B |
| | (6) Surface resistivity, Ω/□ | | | $6.3 \times 10^9$ | $8.5 \times 10^9$ | $8.4 \times 10^9$ | $7.4 \times 10^9$ | $8.6 \times 10^9$ | $7.3 \times 10^9$ | $6.9 \times 10^9$ |
| | (7) Film breakage | | | A | A | A | A | A | A | B |

TABLE 6

| | Type of Resin | Density $10^3$ kg/m³ | Olefin Content % | Ex 19 | Ex 20 | Ex 21 | Ex 22 | Ex 23 |
|---|---|---|---|---|---|---|---|---|
| Intermediate Layer | m-LLDPE 5 | 0.913 | — | 100 | | 100 | 100 | 100 |
| | m-LLDPE 6 | 0.919 | — | | 100 | | | |
| Sealant Layer Resin Composition | SEBS 1 | — | 70 | 100 | 100 | | | |
| | SEBS 2 | — | 58 | | | 100 | | |
| | SEBS 3 | — | 82 | | | | 100 | |
| | SEPS 1 | — | 70 | | | | | 100 |
| | Anti-blocking agent 1 | — | — | 25 | 25 | 25 | 25 | 25 |
| Evaluated Physical Properties etc. | Substrate thickness, μm | | | 25 | 25 | 25 | 25 | 25 |
| | Intermediate layer thickness, μm | | | 15 | 15 | 20 | 15 | 15 |
| | Sealant thickness, μm | | | 20 | 20 | 15 | 20 | 20 |
| | Cover film thickness, μm | | | 60 | 60 | 60 | 60 | 60 |
| | Microparticle content of sealant layer, parts by mass | | | 11.1 | 11.1 | 11.1 | 11.1 | 11.1 |
| | Anti-static layer coating thickness, mg/m² | | | 7 | 7 | 7 | 7 | 7 |
| | (1) Film formation | | | B | B | B | B | B |
| | (2) Haze value, % | | | 24 | 25 | 24 | 23 | 24 |
| | (3) Heat seal | | | A | A | A | B | B |
| | (4) Max/min difference of peel strength | | | A | A | A | A | A |
| | (5) Blocking | | | B | B | B | B | B |
| | (6) Surface resistivity, Ω/□ | | | $5.3 \times 10^9$ | $5.1 \times 10^9$ | $5.2 \times 10^9$ | $6.8 \times 10^9$ | $8.5 \times 10^9$ |
| | (7) Film breakage | | | B | B | B | B | B |

TABLE 7

| | | Type of Resin | Density $10^3$ kg/m³ | Olefin Content % | Comp Ex 1 | Comp Ex 2 | Comp Ex 3 | Comp Ex 4 | Comp Ex 5 | Comp Ex 6 | Comp Ex 7 |
|---|---|---|---|---|---|---|---|---|---|---|---|
| Intermediate Layer | 2nd | m-LLDPE 5 | 0.913 | — | 100 | 100 | 100 | 100 | 100 | 100 | 100 |
| | 1st | m-LLDPE 1 | 0.926 | — | 100 | 100 | 100 | 100 | | | |
| | | m-LLDPE 7 | 0.898 | — | | | | | 100 | | |
| | | Ziegler LLDPE | 0.937 | — | | | | | | 100 | |
| | | HIPS | — | — | | | | | | | 100 |
| Sealant Layer Resin Composition | | SEBS 1 | — | 70 | | | | | 100 | 100 | 100 |
| | | SEBS 4 | — | 33 | 100 | | | | | | |
| | | SEBS 5 | — | 88 | | 100 | | | | | |
| | | SEPS 2 | — | 87 | | | 100 | | | | |
| | | SEPS 3 | — | 35 | | | | 100 | | | |
| | | Anti-blocking agent 1 | — | — | 25 | 25 | 25 | 25 | 25 | 25 | — |
| Evaluated Physical Properties etc. | | Substrate thickness, μm | | | — | 16 | 16 | — | 16 | 16 | 16 |
| | | Intermediate layer 1 thickness, μm | | | — | 10 | 10 | — | 10 | 10 | 10 |
| | | Intermediate layer 2 thickness, μm | | | — | 20 | 20 | — | 20 | 20 | 20 |
| | | Sealant thickness, μm | | | — | 10 | 10 | — | 10 | 10 | 10 |
| | | Cover film thickness, μm | | | — | 56 | 56 | — | 56 | 56 | 56 |
| | | Microparticle content of sealant layer, parts by mass | | | — | 11.1 | 11.1 | — | 11.1 | 11.1 | — |
| | | Anti-static layer coating thickness, mg/m² | | | — | 7 | 7 | — | 7 | 7 | 7 |

TABLE 7-continued

| Type of Resin | Density $10^3$ kg/m$^3$ | Olefin Content % | Comp Ex 1 | Comp Ex 2 | Comp Ex 3 | Comp Ex 4 | Comp Ex 5 | Comp Ex 6 | Comp Ex 7 |
|---|---|---|---|---|---|---|---|---|---|
| (1) Film formation | | | C | B | B | C | B | B | B |
| (2) Haze value, % | | | na | 21 | 20 | na | 20 | 20 | 75 |
| (3) Heat seal | | | na | C | C | na | A | B | B |
| (4) Max/min difference of peel strength | | | na | A | A | na | A | B | C |
| (5) Blocking | | | na | B | B | na | B | B | B |
| (6) Surface resistivity, Ω/□ | | | na | $6.3 \times 10^9$ | $6.1 \times 10^9$ | na | $5.4 \times 10^9$ | $6.3 \times 10^9$ | $4.8 \times 10^9$ |
| (7) Film breakage | | | na | B | C | na | C | C | B |

TABLE 8

| | Type of Resin | Density $10^3$ kg/m$^3$ | Olefin Content % | Comp Ex 8 | Comp Ex 9 | Comp Ex 10 | Comp Ex 11 |
|---|---|---|---|---|---|---|---|
| Intermediate Layer | m-LLDPE 1 | 0.926 | — | 100 | | | |
| | m-LLDPE 7 | 0.898 | — | | 100 | 100 | 100 |
| Sealant Layer | SEBS 1 | — | 70 | | 100 | 100 | 100 |
| | SEBS 5 | — | 88 | 100 | | | |
| | Anti-blocking agent 1 | — | — | 25 | 25 | 25 | 25 |
| Evaluated Physical Properties etc. | Substrate thickness, μm | | | 16 | 16 | 16 | 25 |
| | Intermediate layer thickness, μm | | | 30 | 30 | 30 | 20 |
| | Sealant thickness, μm | | | 10 | 10 | 20 | 10 |
| | Cover film thickness, μm | | | 56 | 56 | 66 | 55 |
| | Microparticle content of sealant layer, parts by mass | | | 11.1 | 11.1 | 11.1 | 11.1 |
| | Anti-static layer coating thickness, mg/m$^2$ | | | 7 | 7 | 7 | 7 |
| | (1) Film formation | | | B | B | B | B |
| | (2) Haze value, % | | | 21 | 20 | 25 | 20 |
| | (3) Heat seal | | | C | A | A | A |
| | (4) Max/min difference of peel strength | | | B | B | B | B |
| | (5) Blocking | | | B | B | B | B |
| | (6) Surface resistivity, Ω/□ | | | $7.5 \times 10^9$ | $3.5 \times 10^9$ | $5.5 \times 10^9$ | $7.4 \times 10^9$ |
| | (7) Film breakage | | | B | C | C | C |

TABLE 9

| | Type of Resin | Density $10^3$ kg/m$^3$ | Olefin Content % | Comp Ex 12 | Comp Ex 13 | Comp Ex 14 | Comp Ex 15 | Comp Ex 16 |
|---|---|---|---|---|---|---|---|---|
| Intermediate Layer | m-LLDPE 5 | 0.913 | — | 100 | 100 | 100 | 100 | 100 |
| Sealant Layer | SEBS 5 | — | 88 | 100 | 100 | | | |
| | SEPS 2 | — | 87 | | | 100 | 100 | |
| | SEPS 3 | — | 35 | | | | | 100 |
| | Anti-blocking agent 1 | — | — | 25 | 25 | 25 | 25 | 25 |
| Evaluated Physical Properties etc. | Substrate thickness, μm | | | 25 | 25 | 25 | 25 | — |
| | Intermediate layer thickness, μm | | | 20 | 20 | 20 | 20 | — |
| | Sealant thickness, μm | | | 10 | 20 | 10 | 20 | — |
| | Cover film thickness, μm | | | 55 | 65 | 55 | 65 | — |
| | Microparticle content of sealant layer, parts by mass | | | 11.1 | 11.1 | 11.1 | 11.1 | — |
| | Anti-static layer coating thickness, mg/m$^2$ | | | 7 | 7 | 7 | 7 | — |
| | (1) Film formation | | | B | B | B | B | — |
| | (2) Haze value, % | | | 20 | 25 | 19 | 25 | na |
| | (3) Heat seal | | | C | C | C | C | na |
| | (4) Max/min difference of peel strength | | | B | B | B | B | na |
| | (5) Blocking | | | B | B | B | B | na |
| | (6) Surface resistivity, Ω/□ | | | $5.2 \times 10^9$ | $6.8 \times 10^9$ | $8.5 \times 10^9$ | $5.2 \times 10^9$ | na |
| | (7) Film breakage | | | B | B | C | C | na |

[Cover Film with Substrate Layer/Intermediate Layer/Sealant Layer/Anti-Static Layer Structure]

Example 24

80 mass % of the ethylene-methyl acrylate random copolymer resin "Elvaloy 1820AC" (Mitsui DuPont Polychemicals) and 20 mass % of an anti-blocking master batch "PEX ABT-16" (Tokyo Printing Ink) (i.e. "anti-blocking agent 1") were blended in a tumbler to obtain a sealant layer resin composition.

Additionally, m-LLDPE "Harmolex NF464N" (Japan Polyethylene) was prepared as the resin to constitute the intermediate layer.

These resins were separately extruded from a uniaxial extruder of diameter 40 mm, and laminated with a multi-manifold die at a delivery rate of 15 m/minute, to form a sealant layer/intermediate layer two-layered film (thickness 30 μm) with a sealant layer of thickness 10 μm and an intermediate layer of thickness 20 μm.

On the other hand, a urethane anchor coating agent was coated to a dry thickness of 2 μm onto the biaxially stretched polyethylene terephthalate film "E5100" (Toyobo, thickness 16 μm) constituting the substrate layer, and laminated by dry lamination so that the coating surface and the surface on the intermediate layer side of the above-described two-layered film are in contact, resulting in a laminated film of overall thickness 48 μm having a substrate layer/intermediate layer/sealant layer structure.

Next, after subjecting the sealant layer surface of the laminated film to a corona treatment, an aqueous emulsion comprising 40 mass % (by solid) cationic polymer anti-static agent "ASA-29CP" (Takamatsu Oil & Fat) and 60 mass % (by solid) acrylic resin (methyl acrylate/methyl methacrylate copolymer resin emulsion "Vinyblan" (Nissin Chemical)) was coated by gravure reverse printing to a thickness of 0.4 μm after drying to form an anti-static layer, resulting in a cover film having a substrate layer/intermediate layer/sealant layer/anti-static layer structure.

Examples 25-27

Using the resins or resin compositions of Table 1 to Table 3 above, a cover film was produced by the same method as Example 24 in the blends shown in Table 10 below.

Example 28

80 mass % of the ethylene-methyl acrylate random copolymer resin "Elvaloy 1820AC" (Mitsui DuPont Polychemicals) and 20 mass % of an anti-blocking master batch "PEX ABT-16" (Tokyo Printing Ink) were blended in a tumbler to obtain a sealant layer resin composition.

Additionally, m-LLDPE "Harmolex NF464N" (Japan Polyethylene) was prepared as the resin to constitute the first intermediate layer.

These resins were separately extruded from a uniaxial extruder of diameter 40 mm, and laminated with a multi-manifold die at a delivery rate of 15 m/minute, to form a sealant layer/first intermediate layer two-layered film of thickness 30 μm with a sealant layer of thickness 10 μm and a first intermediate layer of thickness 20 μm.

On the other hand, a two-solution curable polyurethane anchor coating agent was coated with a roll coater onto the biaxially stretched polyethylene terephthalate film "E5100" (Toyobo, thickness 16 μm) constituting the substrate layer, a melted m-LLDPE "Harmolex NH745" (Japan Polyethylene) constituting the second intermediate layer was extruded to a thickness of 10 μm between this coating surface and the first intermediate layer-side surface of the above-described two-layered film, and a laminated film of overall thickness 56 μm having a substrate layer/second intermediate layer/first intermediate layer/sealant layer structure was obtained by extrusion lamination.

Next, after subjecting the sealant layer surface to a corona treatment, an aqueous emulsion comprising 40 mass % (by solid) cationic polymer anti-static agent "ASA-29CP" (Takamatsu Oil & Fat) and 60 mass % (by solid) acrylic resin (methyl acrylate/methyl methacrylate copolymer resin emulsion "Vinyblan" (Nissin Chemical)) was coated by gravure reverse printing to a thickness of 0.4 μm after drying to form an anti-static layer, resulting in a cover film having a substrate layer/second intermediate layer/first intermediate layer/sealant layer/anti-static layer structure.

Examples 29-43

Cover films were prepared by the same method as Example 28 aside from using the resin compositions and thicknesses shown in the following Tables 10 to 12.

Comparative Examples 17-19

Cover films were prepared by the same method as Example 24, aside from using the resin compositions and thicknesses shown in the following Table 13.

Comparative Examples 20-34

Cover films were prepared by the same method as Example 28, aside from using the resin compositions and thicknesses shown in the following Tables 13 to 15.

(Evaluation Method)

The cover films prepared by Examples 24-43 and Comparative Examples 17-34 were evaluated as described below. The results are shown in Table 10 to Table 15.

(1) Film Formation

The thicknesses of the prepared cover films were measured at 11 points in the width direction (40 mm intervals)×3 points in the flow direction (1 m intervals) for a total of 33 points, to study the variation in thickness in a single cover film. Those with a variation in thickness of ±10% or less were rated "excellent" (A), those of ±20% or less were rated "good" (B), while those exceeding ±20% were rated "poor" (C).

(2) Film Breakage

The film breakage susceptibility was evaluated by the method shown in FIG. 4.

First, a taping device "ST-60" (Systemation) was used to seal a cover film 1 of width 21.5 mm to a 24 mm wide electronic component carrier tape 103 comprising polystyrene under conditions of sealing head width 0.5 mm×2, sealing head length 32 mm, heat sealing pressure 3.5 MPa, delivery length 16 mm and sealing time 0.5 seconds×2 (double seal), and the sealing head temperature was adjusted to obtain average peel strengths of 1.5 N and 2.0 N.

Next, the carrier tape 103 having the cover film 1 sealed thereto was cut to a length of 550 mm as shown in FIG. 4, and adhered with the bottom portions of the pockets of the carrier tape 103 contacting a vertical wall 101 bearing double-sided adhesive tape 102. 50 mm of the cover film 1 were peeled from the top portion of the adhered carrier tape 103, the tip of the peeled cover film 1 was sandwiched by a clip 104, and a weight 106 of mass 1000 g was attached to the clip 104 via a string 105. When the weight 106 was allowed to naturally drop, those in which the cover film 1 did not break even with an average peel strength of 2.0 N were rated "excellent" (A), those in which the cover film 1 did not break at an average peel strength of 1.5 N were rated "good" (B), and those in which the cover film broke at an average peel strength of 1.5 N were rated "poor" (C). Additionally, those for which the film formation was so poor that a film was not obtained are indicated "unrated" (na).

(3) Surface Resistivity

A resistivity meter "Hiresta Up MCP-HT40" (Mitsubishi Chemical) was used to measure the surface resistivity of the sealant surface of the cover film at an atmospheric temperature of 23° C., atmospheric humidity 50% (relative humidity) and applied voltage of 500 V using a method in accordance with JIS K6911. Additionally, those for which the film formation was so poor that a film was not obtained are indicated "unrated" (na).
(4) Total Transmission and (5) Haze The total transmission and haze values were measured using an integrating sphere measuring device in accordance with measuring method A of JIS K 7105: 1998. Those for which the film formation was so poor that a film was not obtained are indicated "unrated" (na). When the haze of a cover film exceeds 50%, it may be difficult to observe the contents during the process of inspecting whether the contents have been correctly inserted after the electronic components have been packaged in the cover film.
(6) Seal A taping device "ST-60" (Systemation) was used to heat seal the 21.5 mm wide cover films at sealing iron temperatures of 140° C. to 180° C. in 10° C. intervals to a 24 mm wide polystyrene carrier tape (Denki Kagaku Kogyo) under conditions of sealing head width 0.5 mm×2, sealing head length 32 mm, heat sealing pressure 3.5 MPa, delivery length 16 mm and heat sealing time 0.2 seconds×2 (double seal). After letting stand for 24 hours in an atmosphere of relative humidity 50% and temperature 23° C., the cover film was peeled at a speed of 300 mm per minute and a peeling angle of 180° in the same atmosphere of relative humidity 50% and temperature 23° C. Those with an average peel strength in the range of 0.3 to 0.8 N when heat sealed at sealing iron temperatures of 140° C. to 180° C. were rated "excellent" (A), those with an average peel strength in the range of 0.2 to 1.0 N when heat sealed at sealing iron temperatures of 140° C. to 180° C. were rated "good" (B), and those with an average peel strength outside this range were rated "poor" (C). Additionally, those for which the film formation was so poor that a film was not obtained are indicated "unrated" (na).
(7) Stability of Peel Strength Over Time 21.5 mm wide cover films were heat sealed to 24 mm wide polystyrene carrier tape (Denki Kagaku Kogyo) using a taping device "ST-60" (Systemation) under conditions of sealing head width 0.5 mm×2, sealing head length 32 mm, sealing pressure 3.5 MPa, delivery length 16 mm and sealing time 0.2 seconds×2 (double seal), with the sealing head temperature adjusted so that after letting stand for 24 hours in an atmosphere of relative humidity 50% and temperature 23° C., the average peeling strength was 0.4 N when peeling the cover film at a speed of 300 mm per minute and peeling angle of 180° in the same atmosphere of relative humidity 50% and temperature 23° C. As a progressive environment test, these were stored for seven days in a high-temperature high-humidity environment of 52° C. and relative humidity 95%, then let stand for 24 hours in an environment of 23° C. and relative humidity 50%, then measured for peel strength. Those wherein the change in the average peel strength after storage in the high-temperature high-humidity environment was less than 0.2 N were rated "excellent" (A), those in which it was at least 0.3 N and less than 0.3 N were rated "good" (B), and those aside from the above were rated "poor" (C). Additionally, those for which the film formation was so poor that a film was not obtained are indicated "unrated" (na).
(8) Blocking 21.5 mm wide cover films were heat sealed to 24 mm wide polystyrene carrier tape (Denki Kagaku Kogyo) using a taping device "ST-60" (Systemation) under conditions of sealing head width 0.5 mm×2, sealing head length 32 mm, sealing pressure 3.5 MPa, delivery length 16 mm and sealing time 0.2 seconds×2 (double seal), with the sealing head temperature adjusted so that after letting stand for 24 hours in an atmosphere of relative humidity 50% and temperature 23° C., the average peeling strength was 0.4 N when peeling the cover film at a speed of 300 mm per minute and peeling angle of 180° in the same atmosphere of relative humidity 50% and temperature 23° C.

Next, the sealed carrier tapes were wound onto a paper tube of diameter 95 mm so as to have the cover films on the outside, and let stand for 3 days and 7 days in an environment of 60° C., then the windings were observed by eye for the presence of adhesion between the carrier tape and the cover film at areas other than the heat sealed portions. Those in which adhesion was observed after 3 days in the 60° C. environment were rated "poor" (C), those in which adhesion was not observed after 3 days but adhesion was observed after 7 days were rated "good" (B), and those in which no adhesion was observed even after 7 days were rated "excellent" (A). Additionally, those for which the film formation was so poor that a film was not obtained are indicated "unrated" (na).

TABLE 10

| | Type of Resin | Olefin Content (mass %) | Ex 24 | Ex 25 | Ex 26 | Ex 27 | Ex 28 | Ex 29 | Ex 30 |
|---|---|---|---|---|---|---|---|---|---|
| 2nd Intermediate Layer | m-LLDPE 5 (mass %) | | | | | | 100 | 100 | 100 |
| 1st Intermediate Layer | m-LLDPE 3 (mass %) | | 100 | 100 | 100 | 100 | 100 | 100 | |
| | m-LLDPE 1 (mass %) | | | | | | | | 100 |
| Sealant Layer | EMA 1 (mass %) | 80 | 80 | | | | 80 | | |
| | EMMA 1 (mass %) | 80 | | 80 | | | | | |
| | SEBS 1 (mass %) | 70 | | | 80 | | | 80 | |
| | SEBS 2 (mass %) | 58 | | | | 80 | | | 80 |
| | Anti-blocking agent 1 (mass %) | | 20 | 20 | 20 | 20 | 20 | 20 | 20 |
| Anti-static Layer | Cationic polymer anti-static agent 1 (mass %) | | 40 | 40 | 40 | 40 | 40 | 40 | 40 |
| | Acrylic resin emulsion 1 (mass %) | | 60 | 60 | 60 | 60 | 60 | 60 | 60 |
| Evaluation of Physical Properties etc. | Total thickness (μm) and lamination method of substrate layer/2nd intermediate layer/1st intermediate layer/sealant layer | | 48 dry | 48 dry | 48 dry | 48 dry | 56 extrusion | 56 extrusion | 56 extrusion |
| | Anti-static layer thickness (μm) | | 0.4 | 0.4 | 0.4 | 0.4 | 0.4 | 0.4 | 0.4 |
| | (1) Film formation | | B | B | B | B | B | B | B |
| | (2) Film breakage | | A | A | A | A | A | A | A |
| | (3) Surface resistivity (Ω/□) | | 3.5E+09 | 2.7E+09 | 3.3E+09 | 4.5E+09 | 3.0E+09 | 4.9E+09 | 3.7E+09 |
| | (4) Total transmission (%) | | 90 | 90 | 90 | 90 | 89 | 90 | 89 |

TABLE 10-continued

| Type of Resin | Olefin Content (mass %) | Ex 24 | Ex 25 | Ex 26 | Ex 27 | Ex 28 | Ex 29 | Ex 30 |
|---|---|---|---|---|---|---|---|---|
| (5) Haze (%) | | 31 | 33 | 29 | 30 | 35 | 32 | 34 |
| (6) Seal | | B | B | A | A | B | A | A |
| (7) Stability of peel strength over time | | B | B | A | A | B | A | A |
| (8) Blocking | | B | B | B | B | B | B | B |

TABLE 11

| | Type of Resin | Olefin Content (mass %) | Ex 31 | Ex 32 | Ex 33 | Ex 34 | Ex 35 | Ex 36 |
|---|---|---|---|---|---|---|---|---|
| 2nd Intermediate Layer | m-LLDPE 5 (mass %) | | 100 | 100 | 100 | 100 | 100 | 100 |
| 1st Intermediate Layer | m-LLDPE 1 (mass %) | | 80 | 60 | 80 | 80 | 80 | 80 |
| | LDPE 1 (mass %) | | 20 | 40 | 20 | 20 | 20 | 20 |
| Sealant Layer | SEBS 1 (mass %) | 70 | 80 | 80 | 80 | 80 | 80 | 80 |
| | Anti-blocking agent 1 (mass %) | | 20 | 20 | 20 | 20 | 20 | 20 |
| Anti-static Layer | Cationic polymer anti-static agent 1 (mass %) | | 40 | 40 | | | | |
| | Cationic polymer anti-static agent 2 (mass %) | | | | 40 | | 40 | 40 |
| | Cationic polymer anti-static agent 3 (mass %) | | | | | 40 | | |
| | Acrylic resin emulsion 1 (mass %) | | 60 | 60 | 60 | 60 | | |
| | Acrylic resin emulsion 2 (mass %) | | | | | | 60 | |
| | Acrylic resin emulsion 3 (mass %) | | | | | | | 60 |
| Evaluation of Physical Properties etc. | Total thickness (μm) and lamination method of substrate layer/2nd intermediate layer/1st intermediate layer/sealant layer | | 56 extrusion | 56 extrusion | 56 extrusion | 56 extrusion | 56 extrusion | 56 extrusion |
| | Anti-static layer thickness (μm) | | 0.4 | 0.4 | 0.4 | 0.4 | 0.4 | 0.4 |
| | (1) Film formation | | A | A | A | A | A | A |
| | (2) Film breakage | | A | B | A | A | A | A |
| | (3) Surface resistivity (Ω/□) | | 3.2E+09 | 4.0E+09 | 2.9E+09 | 1.0E+09 | 6.5E+09 | 2.0E+09 |
| | (4) Total transmission (%) | | 90 | 90 | 92 | 90 | 93 | 89 |
| | (5) Haze (%) | | 33 | 30 | 23 | 30 | 22 | 35 |
| | (6) Seal | | A | A | A | A | A | A |
| | (7) Stability of peel strength over time | | A | A | A | A | A | A |
| | (8) Blocking | | B | B | B | B | B | B |

TABLE 12

| | Type of Resin | Olefin Content (mass %) | Ex 37 | Ex 38 | Ex 39 | Ex 40 | Ex 41 | Ex 42 | Ex 43 |
|---|---|---|---|---|---|---|---|---|---|
| 2nd Intermediate Layer | m-LLDPE 5 (mass %) | | 100 | 100 | 100 | 100 | 100 | 100 | 100 |
| 1st Intermediate Layer | m-LLDPE 1 (mass %) | | 80 | 80 | 80 | 80 | 80 | 80 | 80 |
| | LDPE 1 (mass %) | | 20 | 20 | 20 | 20 | 20 | 20 | 20 |
| Sealant Layer | EMA 1 (mass %) | 80 | | | | | | 80 | 80 |
| | SEBS 1 (mass %) | 70 | 80 | 80 | 80 | 80 | 80 | | |
| | Anti-blocking agent 1 (mass %) | | 20 | 20 | 20 | 20 | 20 | 20 | 20 |
| Anti-static Layer | Cationic polymer anti-static agent 2 (mass %) | | 15 | 70 | 40 | 40 | 40 | 35 | 35 |
| | Acrylic resin emulsion 1 (mass %) | | 85 | 30 | 60 | 60 | 60 | 50 | 35 |
| | Anti-blocking agent 2 (mass %) | | | | | | | 15 | |
| | Anti-blocking agent 3 (mass %) | | | | | | | | 30 |
| Evaluation of Physical Properties etc. | Total thickness (μm) and lamination method of substrate layer/2nd intermediate layer/1st intermediate layer/sealant layer | | 56 extrusion | 56 extrusion | 56 extrusion | 56 extrusion | 56 extrusion | 56 extrusion | 56 extrusion |
| | Anti-static layer thickness (μm) | | 0.4 | 0.4 | 0.05 | 0.2 | 1.2 | 0.4 | 0.4 |
| | (1) Film formation | | A | A | A | A | A | A | A |
| | (2) Film breakage | | A | A | A | A | A | A | A |
| | (3) Surface resistivity (Ω/□) | | 5.4E+10 | 4.0E+09 | 4.5E+10 | 3.5E+09 | 7.5E+08 | 7.5E+09 | 6.4E+09 |
| | (4) Total transmission (%) | | 91 | 92 | 92 | 92 | 92 | 89 | 90 |
| | (5) Haze (%) | | 27 | 24 | 23 | 22 | 24 | 34 | 27 |
| | (6) Seal | | A | B | B | A | A | B | B |
| | (7) Stability of peel strength over time | | A | B | A | A | B | B | B |
| | (8) Blocking | | B | B | B | B | B | A | A |

TABLE 13

| | Type of Resin | Olefin Content (mass %) | Comp Ex 17 | Comp Ex 18 | Comp Ex 19 | Comp Ex 20 | Comp Ex 21 | Comp Ex 22 |
|---|---|---|---|---|---|---|---|---|
| 2nd Intermediate Layer | m-LLDPE 5 (mass %) | | | | | 100 | 100 | 100 |
| 1st Intermediate Layer | LDPE 1 (mass %) | | 100 | 100 | 100 | 100 | 100 | 100 |
| Sealant Layer | EMA 1 (mass %) | 80 | 80 | | | 80 | | |
| | EMMA 1 (mass %) | 80 | | 80 | | | 80 | |
| | SEBS 1 (mass %) | 70 | | | 80 | | | 80 |
| | Anti-blocking agent 1 (mass %) | | 20 | 20 | 20 | 20 | 20 | 20 |
| Anti-static Layer | Cationic polymer anti-static agent 1 (mass %) | | 40 | 40 | 40 | 40 | 40 | 40 |
| | Acrylic resin emulsion 1 (mass %) | | 60 | 60 | 60 | 60 | 60 | 60 |
| Evaluation of Physical Properties etc. | Total thickness (μm) and lamination method of substrate layer/2nd intermediate layer/1st intermediate layer/sealant layer | | 48 dry | 48 dry | 48 dry | 56 extrusion | 56 extrusion | 56 extrusion |
| | Anti-static layer thickness (μm) | | 0.4 | 0.4 | 0.4 | 0.4 | 0.4 | 0.4 |
| | (1) Film formation | | A | A | A | A | A | B |
| | (2) Film breakage | | C | C | C | C | C | C |
| | (3) Surface resistivity (Ω/□) | | 4.6E+09 | 5.2E+09 | 3.5E+09 | 6.7E+09 | 3.3E+09 | 4.9E+09 |
| | (4) Total transmission (%) | | 90 | 90 | 90 | 90 | 90 | 90 |
| | (5) Haze (%) | | 30 | 28 | 29 | 26 | 32 | 32 |
| | (6) Seal | | B | B | A | B | B | A |
| | (7) Stability of peel strength over time | | B | B | A | B | B | A |
| | (8) Blocking | | B | B | B | B | B | B |

TABLE 14

| | Type of Resin | Olefin Content (mass %) | Comp Ex 23 | Comp Ex 24 | Comp Ex 25 | Comp Ex 26 | Comp Ex 27 | Comp Ex 28 | Comp Ex 29 |
|---|---|---|---|---|---|---|---|---|---|
| 2nd Intermediate Layer | m-LLDPE 5 (mass %) | | 100 | 100 | 100 | 100 | 100 | 100 | 100 |
| 1st Intermediate Layer | m-LLDPE 1 (mass %) | | 80 | 80 | 80 | 80 | 80 | 80 | 80 |
| | LDPE 1 (mass %) | | 20 | 20 | 20 | 20 | 20 | 20 | 20 |
| Sealant Layer | EMA2 (mass %) | 90 | 80 | | | | | | |
| | EMMA 2 (mass %) | 90 | | 80 | | | | | |
| | SEBS 1 (mass %) | 70 | | | | | | 80 | 80 |
| | SEBS 4 (mass %) | 33 | | | 80 | | | | |
| | SEBS 5 (mass %) | 88 | | | | 80 | | | |
| | SBS 1 (mass %) | 16 | | | | | 100 | | |
| | Anti-blocking agent 1 (mass %) | | 20 | 20 | 20 | 20 | | 20 | 20 |
| Anti-static Layer | Cationic polymer anti-static agent 1 (mass %) | | 40 | 40 | 40 | 40 | 40 | | |
| | Cationic surfactant (mass %) | | | | | | | 100 | 100 |
| | Acrylic resin emulsion 1 (mass %) | | 60 | 60 | 60 | 60 | 60 | | |
| Evaluation of Physical Properties etc. | Total thickness (μm) and lamination method of substrate layer/2nd intermediate layer/1st intermediate layer/sealant layer | | 56 extrusion | 56 extrusion | 56 extrusion | 56 extrusion | 56 extrusion | 56 extrusion | 56 extrusion |
| | Anti-static layer thickness (μm) | | 0.4 | 0.4 | 0.4 | 0.4 | 0.4 | 0.2 | 0.05 |
| | (1) Film formation | | A | A | C | A | A | A | A |
| | (2) Film breakage | | A | A | na | A | C | A | A |
| | (3) Surface resistivity (Ω/□) | | 3.1E+09 | 5.2E+09 | na | 5.7E+09 | 3.2E+09 | 4.2E+08 | 7.8E+09 |
| | (4) Total transmission (%) | | 90 | 90 | na | 90 | 90 | 94 | 94 |
| | (5) Haze (%) | | 27 | 29 | na | 28 | 26 | 23 | 23 |
| | (6) Seal | | C | C | na | C | B | C | C |
| | (7) Stability of peel strength over time | | C | C | na | C | C | C | C |
| | (8) Blocking | | B | B | na | B | B | B | C |

TABLE 15

| | Type of Resin | Olefin Content (mass %) | Comp Ex 30 | Comp Ex 31 | Comp Ex 32 | Comp Ex 33 | Comp Ex 34 |
|---|---|---|---|---|---|---|---|
| 2nd Intermediate Layer | m-LLDPE 5 (mass %) | | 100 | 100 | 100 | 100 | 100 |
| 1st Intermediate Layer | m-LLDPE 1 (mass %) | | 80 | 80 | 80 | 80 | 80 |
| | LDPE 1 (mass %) | | 20 | 20 | 20 | 20 | 20 |
| Sealant Layer | SEBS 1 (mass %) | 70 | 80 | 80 | 80 | 80 | 80 |
| | Anti-blocking agent 1 (mass %) | | 20 | 20 | 20 | 20 | 20 |

TABLE 15-continued

| Type of Resin | | Olefin Content (mass %) | Comp Ex 30 | Comp Ex 31 | Comp Ex 32 | Comp Ex 33 | Comp Ex 34 |
|---|---|---|---|---|---|---|---|
| Anti-static Layer | Cationic polymer anti-static agent 1 (mass %) | | 40 | 40 | | | |
| | Cationic surfactant (mass %) | | | | 40 | 15 | 70 |
| | Acrylic resin emulsion 1 (mass %) | | | | 60 | 85 | 30 |
| | EVA emulsion (mass %) | | 60 | | | | |
| | Polyester resin emulsion (mass %) | | | 60 | | | |
| Evaluation of Physical Properties etc. | Total thickness (μm) and lamination method of substrate layer/ 2nd intermediate layer/1st intermediate layer/sealant layer | | 56 extrusion | 56 extrusion | 56 extrusion | 56 extrusion | 56 extrusion |
| | Anti-static layer thickness (μm) | | 0.4 | 0.4 | 0.4 | 0.4 | 0.4 |
| | (1) Film formation | | A | A | A | A | A |
| | (2) Film breakage | | A | A | A | A | A |
| | (3) Surface resistivity (Ω/□) | | 4.7E+09 | 5.2E+09 | 1.2E+10 | 7.5E+10 | 2.3E+09 |
| | (4) Total transmission (%) | | 84 | 87 | 90 | 90 | 90 |
| | (5) Haze (%) | | 60 | 55 | 35 | 39 | 30 |
| | (6) Seal | | B | C | B | B | C |
| | (7) Stability of peel strength over time | | C | C | C | C | C |
| | (8) Blocking | | C | C | B | B | B |

Examples of the present invention have been explained above. These examples are merely exemplary, and those skilled in the art will recognize that various modifications are possible and that such modifications lie within the scope of the present invention.

The invention claimed is:

1. A cover film, comprising:
a substrate layer;
an intermediate layer comprising a resin composition comprising, by at least 50 mass %, a metallocene linear low-density polyethylene resin having a density of 0.900 to 0.940×10³ kg/m³;
a sealant layer comprising an ethylenic copolymer resin comprising, by 50 to 85 mass %, an olefin component, said ethylenic copolymer resin being at least one selected from the group consisting of an ethylene-acrylic acid ester random copolymer resin, an ethylene-methacrylic acid ester random copolymer resin, a hydrogenated styrene-butadiene-styrene block copolymer, and a hydrogenated styrene-isoprene-styrene block copolymer; and
an anti-static layer formed on a surface on the sealant layer side and comprising a resin composition comprising, dispersed in 40 to 80 mass % of an acrylic resin, 20 to 60 mass % of a cationic macromolecular anti-static agent comprising a side chain with a quaternary ammonium salt of formula (I):

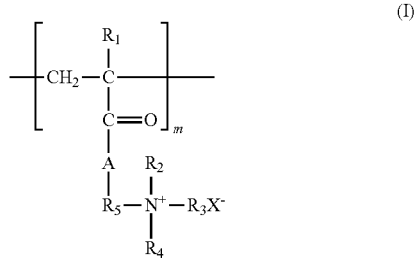

wherein A represents an oxygen atom or an imino group,
$R_1$ represents a hydrogen atom or a methyl group,
$R_2$, $R_3$ and $R_4$ represent alkyl groups having 1 to 18 carbon atoms which are identical or different,
$R_5$ represents an alkylene group having 1 to 4 carbon atoms,
X represents an anion, and
m represents an integer in the range of 1 to 5000.

2. The cover film of claim 1, wherein the ethylenic copolymer resin comprised in the sealant layer is an ethylene-acrylic acid ester random copolymer resin.

3. The cover film of claim 1, wherein the sealant layer comprises, by 5 to 30 mass %, at least one organic microparticle or inorganic microparticle.

4. The cover film of claim 1, wherein the substrate layer comprises a biaxially stretched polyethylene terephthalate or a resin composition comprising a biaxially stretched polyethylene terephthalate.

5. The cover film of claim 1, wherein the anti-static layer comprises, by 10 to 50 mass %, at least one organic microparticle or inorganic microparticle.

6. An electronic component package, comprising a cover film of claim 1, heat sealed to an embossed carrier tape housing an electronic component.

7. The package of claim 6, wherein the ethylenic copolymer resin comprised in the sealant layer of the cover film is an ethylene-acrylic acid ester random copolymer resin.

8. The package of claim 6, wherein the sealant layer of the cover film comprises, by 5 to 30 mass %, at least one organic microparticle or inorganic microparticle.

9. The package of claim 6, wherein the substrate layer of the cover film comprises a biaxially stretched polyethylene terephthalate or a resin composition comprising a biaxially stretched polyethylene terephthalate.

10. The package of claim 6, wherein the anti-static layer comprises, by 10 to 50 mass %, at least one organic microparticle or inorganic microparticle.

11. The cover film of claim 1, wherein the ethylenic copolymer resin comprised in the sealant layer is an ethylene-methacrylic acid ester random copolymer resin.

12. The cover film of claim 1, wherein the ethylenic copolymer resin comprised in the sealant layer is a hydrogenated styrene-butadiene-styrene block copolymer.

13. The cover film of claim 1, wherein the ethylenic copolymer resin comprised in the sealant layer is a hydrogenated styrene-isoprene-styrene block copolymer.

14. The cover film of claim 1, wherein the cover film has a laminar structure of the form: substrate layer/intermediate layer/sealant layer/anti-static layer.

15. The package of claim 6, wherein the ethylenic copolymer resin comprised in the sealant layer of the cover film is an ethylene-methacrylic acid ester random copolymer resin.

16. The package of claim 6, wherein the ethylenic copolymer resin comprised in the sealant layer is a hydrogenated styrene-butadiene-styrene block copolymer.

17. The package of claim 6, wherein the ethylenic copolymer resin comprised in the sealant layer is a hydrogenated styrene-isoprene-styrene block copolymer.

18. The package of claim 6, wherein the cover film has a laminar structure of the form: substrate layer/intermediate layer/sealant layer/anti-static layer.

* * * * *

UNITED STATES PATENT AND TRADEMARK OFFICE
CERTIFICATE OF CORRECTION

Page 1 of 1

PATENT NO. : 8,652,601 B2
APPLICATION NO. : 13/256138
DATED : February 18, 2014
INVENTOR(S) : Takayuki Iwasaki et al.

It is certified that error appears in the above-identified patent and that said Letters Patent is hereby corrected as shown below:

On the title page, Item (86), the PCT information is incorrect. Item (86) should read:

--(86)  PCT No.:  PCT/JP2010/053673

§ 371 (c)(1),
(2), (4) Date:  Sep. 12, 2011--

Signed and Sealed this
Seventeenth Day of June, 2014

Michelle K. Lee
*Deputy Director of the United States Patent and Trademark Office*